(12) United States Patent
Bae et al.

(10) Patent No.: US 10,128,822 B2
(45) Date of Patent: Nov. 13, 2018

(54) INTEGRATED CIRCUITS FOR CONTROLLING SLEW RATES OF SIGNALS

(71) Applicant: Samsung Electronics Co., Ltd., Suwon-si, Gyeonggi-do (KR)

(72) Inventors: Jun Han Bae, Hwaseong-si (KR); Jae Hyun Park, Seoul (KR); Jong Shin Shin, Yongin-si (KR); Jin Ho Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 15/405,893

(22) Filed: Jan. 13, 2017

(65) Prior Publication Data

US 2018/0159517 A1    Jun. 7, 2018

(30) Foreign Application Priority Data

Dec. 2, 2016    (KR) .................. 10-2016-0163341

(51) Int. Cl.
*H03B 1/00*    (2006.01)
*H03K 3/00*    (2006.01)
*H03K 5/04*    (2006.01)

(52) U.S. Cl.
CPC ..................... *H03K 5/04* (2013.01)

(58) Field of Classification Search
CPC ............ H03K 5/003; H03K 5/04; H03K 5/07
USPC .................................................. 327/108–112
See application file for complete search history.

(56) References Cited

U.S. PATENT DOCUMENTS

| 4,622,482 | A | 11/1986 | Ganger |
| 6,411,126 | B1 | 6/2002 | Tinsley et al. |
| 6,744,287 | B2 | 6/2004 | Mooney et al. |
| 7,019,551 | B1 | 3/2006 | Biesterfeldt |
| 8,633,736 | B2 | 1/2014 | Illegems |
| 8,643,419 | B2 | 2/2014 | Rueger |
| 8,674,737 | B1 | 3/2014 | Kossel et al. |
| 9,024,659 | B2 | 5/2015 | Ali et al. |
| 9,614,505 | B1* | 4/2017 | Cho .................. H03K 17/08142 |
| 2013/0162304 | A1 | 6/2013 | Kim |

\* cited by examiner

*Primary Examiner* — Lincoln Donovan
*Assistant Examiner* — Diana J Cheng
(74) *Attorney, Agent, or Firm* — Ward and Smith, P.A.

(57) ABSTRACT

An integrated circuit includes a differential signal driver that receives a first signal from a first input terminal, receives a second signal, which is a differential signal of the first signal, from a second input terminal, outputs a first output signal corresponding to the first signal to a first output terminal, and outputs a second output signal corresponding to the second signal to a second output terminal. The integrated circuit further includes a first capacitor unit connected to the first output terminal and controlling a slew rate of the first output signal based on a first capacitance, a second capacitor unit connected to the second output terminal and controlling a slew rate of the second output signal based on a second capacitance, and a phase selection unit that receives the first signal and provides the first signal to the second capacitor unit, and that receives the second signal and provides the second signal to the first capacitor unit, so as to control the slew rates of the first and second output signals.

19 Claims, 12 Drawing Sheets

(a)

| Capacitance Value[AU] | Case A | Case B |
|---|---|---|
| 0 | 100.5 | 100.5 |
| 1 | 114.3 | 105.8 |
| 2 | 131.5 | 110.0 |
| 3 | 150.8 | 115.3 |
| 4 | 172.0 | 120.1 |
| 5 | 192.1 | 125.5 |
| 6 | 209.3 | 130.0 |
| 7 | 230.0 | 135.5 |

(b)

(a)

| Capacitance Value[AU] | Case A | Case B |
|---|---|---|
| 0 | 100.5 | 100.5 |
| 1 | 112.2 | 105.7 |
| 2 | 129.7 | 110.0 |
| 3 | 148.9 | 115.3 |
| 4 | 171.1 | 120.1 |
| 5 | 191.4 | 125.5 |
| 6 | 209.0 | 130.0 |
| 7 | 230.0 | 135.5 |

(b)

INTEGRATED CIRCUITS FOR CONTROLLING SLEW RATES OF SIGNALS

This application claims priority from Korean Patent Application No. 10-2016-0163341 filed on Dec. 2, 2016 in the Korean Intellectual Property Office, the disclosure of which is incorporated herein by reference in its entirety.

BACKGROUND

1. Field of the Inventive Concept

The present inventive concept relates to integrated circuits, and more particularly to driver circuits for transmitting a signal.

2. Description of the Related Art

As integrated circuits have become more highly integrated, higher-speed processing capabilities are required. Further, the specifications of integrated circuit devices have increased. For example, it is desirable to control the slew rate of an output signal of a transmission driver in a high-speed interface. When the slew rate of the output signal of the transmission driver is excessively high, electromagnetic interference (EMI) noise may be generated. In contrast, when the slew rate of the output signal of the transmission driver is excessively low, the transmission drive may not match the specification of the high-speed interface.

SUMMARY

Some aspects of the present inventive concepts provide an integrated circuit that can control the slew rate of an output signal of a driver.

The above and other aspects of the present inventive concept will become more apparent to one of ordinary skill in the art to which the present inventive concept pertains by referencing the detailed description of the present inventive concept given below.

According to some embodiments of the present inventive concepts, an integrated circuit, comprising a differential signal driver receiving a first signal from a first input terminal, receiving a second signal, which is a differential signal of the first signal, from a second input terminal, outputting a first output signal corresponding to the first signal to a first output terminal, and outputting a second output signal corresponding to the second signal to a second output terminal, a first capacitor unit connected to the first output terminal and controlling a slew rate of the first output signal depending on first capacitance, a second capacitor unit connected to the second output terminal and controlling a slew rate of the second output signal depending on second capacitance and a phase selection unit receiving the first signal and providing this first signal to the second capacitor unit in a first mode, and receiving the second signal and providing this second signal to the first capacitor unit, so as to decrease the slew rates of the first and second output signals.

According to some embodiments of the present inventive concept, An integrated circuit, comprising a driver receiving a first signal having a first phase from an input terminal and outputting a first output signal to an output node and a slew rate control unit connected in parallel with the driver between the input terminal and the output node, receiving the first signal, and controlling a slew rate of the first output signal, wherein the slew rate control unit includes a phase selection unit receiving the first signal and outputting a second signal having a second phase opposite to that of the first phase in a first mode, and receiving the first signal and outputting a third signal having the first phase in a second mode and a capacitor unit connected with the phase selection unit, passing the second signal through a capacitor disposed between the phase selection unit and the output node in the first mode to output a fourth signal, and passing the third signal through the capacitor in the second mode to output a fifth signal.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, an electronic system including an integrated circuit according to an embodiment will be described with reference to FIG. 1.

Figure 1:
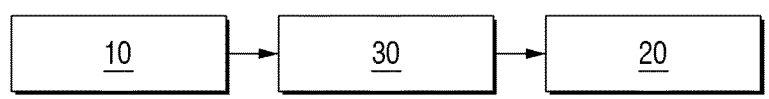
FIG. 1 is an exemplary block diagram showing an electronic system including an integrated circuit according to an embodiment of the inventive concepts.

FIG. 1 is a block diagram showing an electronic system including an integrated circuit according to an embodiment of the present inventive concept.

Referring to FIG. 1, the electronic system may include a processor 10, a storage device 20, and an interface 30. However, the present inventive concepts are not limited thereto. For example, the electronic system may further include units other than the processor 10, the storage device 20, and the interface 30.

The electronic system may include any electronic circuit, system or device capable of transmitting and/or receiving information in a wireless environment, such as personal digital assistants (PDA), portable computers, web tablets, wireless phones, mobile phones, digital music players, memory cards, etc.

The processor 10, for example, may be an application processor. The processor 10 may perform an operation associated with driving the electronic system. In an embodiment of the present inventive concepts, the processor 10 may be configured in a multi-core environment including a plurality of cores.

The processor 10 may include a central processing unit, a multimedia system, a memory system, and a peripheral circuit. The central processing unit, the multimedia system, the memory system, and the peripheral circuit may be connected with each other through a bus.

The multimedia system may be used to perform various multimedia functions in the electronic system. This multimedia system may include a unit, such as a 3D engine module, a video codec, a display system, a camera system, a post-processor, and the like.

The memory system may provide an environment that enables the processor 10 to be connected to an external memory (for example, the storage device 20), and to operate at high speed. In an embodiment of the present inventive concepts, the memory system may include an additional controller (for example, a storage device controller) for controlling an external memory (for example, the storage device 20).

The peripheral circuit may provide an environment that enables the electronic system to be easily connected with an external device (for example, a main board). Therefore, the peripheral circuit may be provided with various interfaces enabling external devices connected to the electronic system to be compatible with each other.

The bus may be used in the data communication of the central processing unit, the multimedia system, the memory system, and the peripheral circuit with each other. In some embodiments of the present inventive concepts, the bus may have a multi-layer structure. Examples of this bus may include a multi-layer advanced high-performance bus (multi-layer AHB) and a multi-layer advanced extensible interface (multi-layer AXI), but the present inventive concepts are not limited thereto.

The storage device 20 may, for example, include a solid state drive (SSD). However, the present inventive concepts are not limited thereto. For example, the storage device 20 may include a receiver that receives a signal from the processor 10, such as a modem or a radio frequency integrated circuit (RFIC).

The interface 30 may transmit the signal output from the processor 10 to the storage device 20. An integrated circuit according to the inventive concepts may be included in the interface 30.

Hereinafter, integrated circuits according to some embodiments of the present inventive concepts will be described with reference to FIGS. 2 to 17.

Figure 2:
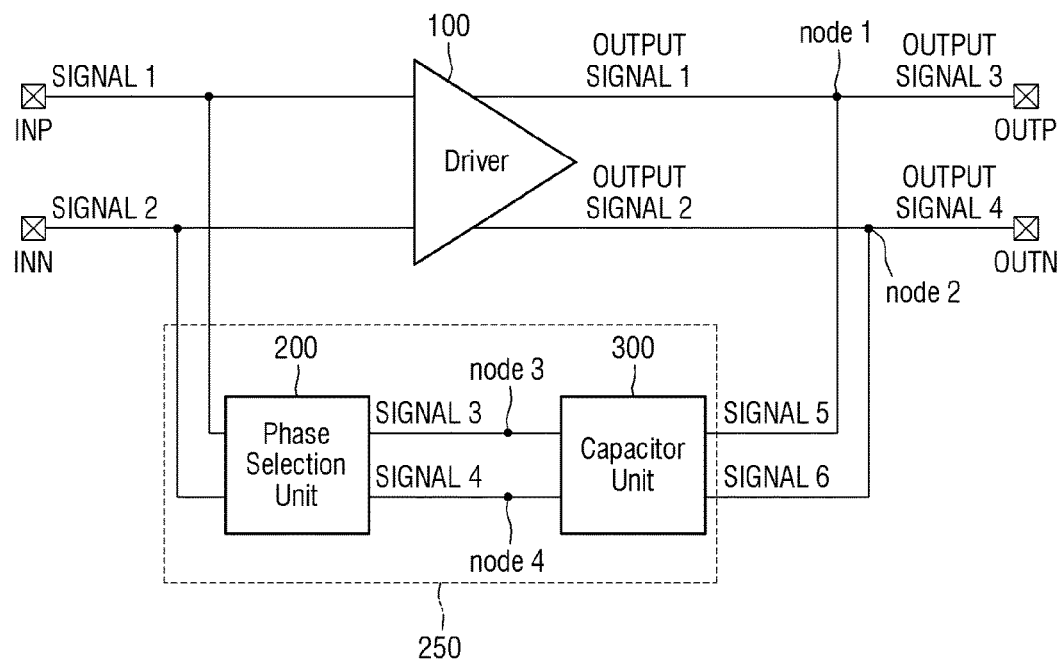
FIG. 2 is an exemplary diagram showing an integrated circuit according to an embodiment of the inventive concepts.

FIG. 2 is an exemplary diagram showing an integrated circuit according to an embodiment of the present inventive concept.

Referring to FIG. 2, an integrated circuit according to an embodiment of the present inventive concepts may include a differential signal driver 100, a phase selection unit 200, and a capacitor unit 300. A circuit according to some embodiments of the present inventive concepts may be used as the interface 30 of FIG. 1.

The differential signal driver 100 may receive a differential signal pair. The differential signal pair input to the differential signal driver 100 may include a first signal (signal 1) and a second signal (signal 2) which is a differential signal of the first signal (signal 1).

Specifically, the differential signal driver 100 may respectively receive the first signal (signal 1) and the second signal (signal 2) from a first input terminal INP and a second input terminal INN. The first signal (signal 1) may have a first phase. The second signal (signal 2) may have a second phase. The difference between the first phase and the second phase may be 180°. In other words, a differential signal may be input to the differential signal driver 100.

The differential signal driver 100 may output a differential signal pair. The differential signal pair output from the differential signal driver 100 may include a first output signal (output signal 1) and a second output signal (output signal 2) which is a differential signal of the first output signal (output signal 1). The difference in phase between the first output signal (output signal 1) and the second output signal (output signal 2) may be 180°.

Specifically, the differential signal driver 100 may output the first output signal (output signal 1) corresponding to the first signal (signal 1) and the second output signal (output signal 2) corresponding to the second signal (signal 2). The first output signal (output signal 1) and second output signal (output signal 2) output from the differential signal driver 100 may be respectively output to a first output terminal OUTP and a second output terminal OUTN. Specifically, the first output signal (output signal 1) may be added to a fifth signal (signal 5) at a first node (node 1) and then output to the first output terminal OUTP. Further, the second output signal (output signal 2) may be added to a sixth signal (signal 6) at a second node (node 2) and then output to the second output terminal OUTN.

In this case, the signal added to the fifth signal (signal 5) at the first node (node 1) and then output to the first output terminal OUTP may be a third output signal (output signal 3) in which the slew rate of the first output signal (output signal 1) is controlled. Further, the signal added to the sixth signal (signal 6) at the second node (node 2) and then output to the second output terminal OUTN may be a fourth output signal (output signal 4) in which the slew rate of the second output signal (output signal 2) is controlled.

The slew rate refers to the rate of change an output signal (for example, voltage) per unit time. Increasing the slew rate increases the rate of change of the output signal per unit time. Conversely, decreasing the slew rate decreases the rate of change of the output signal per unit time.

A slew rate control unit 250 may be connected in parallel with the differential signal driver 100 between the first and second input terminals INP and INN and the first and second output terminals OUTP and OUTN. The slew rate control unit may include a phase selection unit 200 and a capacitor unit 300.

The slew rate control unit 250 may receive the first signal (signal 1) and the second signal (signal 2), which are a differential signal pair, and control the slew rates of the first output signal (output signal 1) and second output signal (output signal 2), which are a differential signal pair. In some embodiments, the slew rate control unit may control the slew rates of the first output signal (output signal 1) and second output signal (output signal 2) at the same time.

The phase selection unit 200 may determine whether to increase or decrease the slew rates of the first output signal (output signal 1) and second output signal (output signal 2). Specifically, the phase selection unit 200 may receive the first signal (signal 1) and the second signal (signal 2), and output the third signal (signal 3) and the fourth signal (signal 4). Two input terminals of the phase selection unit 200 may be electrically connected with the first input terminal INP and the second input terminal INN, respectively. Two output terminals of the phase selection unit 200 may be electrically connected with a third node (node 3) and a fourth node (node 4), respectively. That is, the third signal (signal 3) may be output to the third node (node 3), and the fourth signal (signal 4) may be output to the fourth node (node 4). The phase selection unit 200 may control the slew rates of the first output signal (output signal 1) and second output signal (output signal 2) at the same time so as to increase or decrease the slew rates thereof.

The capacitor unit 300 may be disposed between the phase selection unit 200 and the first and second output terminals OUTP and OUTN.

Two input terminals of the capacitor unit 300 may be electrically connected with the phase selection unit 200 through the third node (node 3) and the fourth node (node 4). The capacitor unit 300 may receive the third signal (signal 3) and fourth signal (signal 4) output from the phase selection unit 200. In the embodiments illustrated in FIG. 2, not additional components are disposed between the phase selection unit 200 and the capacitor unit 300, but the present inventive concept is not limited thereto. For example, other components, such as an inverter and/or a buffer, may be disposed between the phase selection unit 200 and the capacitor unit 300. In this case, the output signals of the phase selection unit 200, input to the capacitor unit 300, may be passed through the components disposed between the phase selection unit 200 and the capacitor unit 300.

The two output terminals of the capacitor unit 300 may be electrically connected with the first node (node 1) and the second node (node 2). In some embodiments, the two output terminals of the capacitor unit 300 may be directly connected with the first node (node 1) and the second node (node 2).

The capacitor unit 300 may determine the increment or decrement of the slew rates of the first output signal (output signal 1) and second output signal (output signal 2), as described in more detail below.

Figure 3:
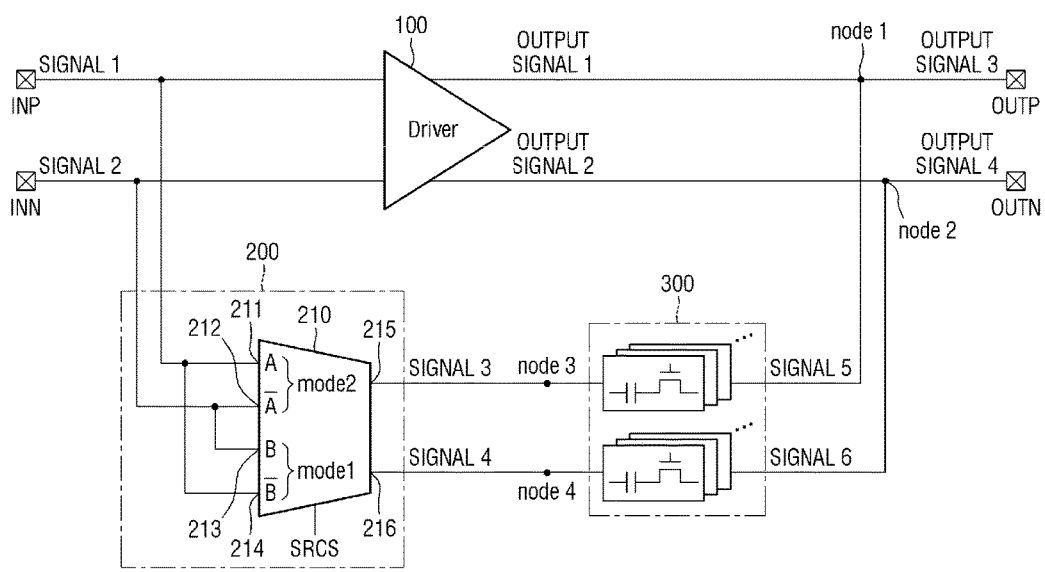
FIG. 3 is an exemplary diagram showing the configuration of a phase selection unit and a capacitor unit according to an embodiment of the inventive concepts.

FIG. 3 is an exemplary diagram showing the configuration of a phase selection unit 200 and a capacitor unit 300 according to some embodiments of the inventive concepts.

Referring to FIG. 3, the phase selection unit 200 may include a multiplexer 210 that selects one of a first mode (mode 1) and a second mode (mode 2) in response to a slew rate control signal SRCS.

The multiplexer 210 may include first to fourth multiplex input terminals 211 to 214, a first multiplex output terminal 215 and a second multiplex output terminal 216. The first to fourth multiplex input terminals 211 to 214 may be electrically connected to the first input terminal INP and the second input terminal INN. In some embodiments, the first and fourth multiplex input terminals 211 and 214 may be directly connected to the first input terminal INP, while the second and third multiplex input terminals 212 and 213 may be directly connected to the second input terminal INN.

The first multiplex output terminal 215 may be connected to the third node (node 3). The third signal (signal 3) output from the first multiplex output terminal 215 may be input to the capacitor unit 300 through the third node (node 3). The second multiplex terminal 216 may be connected to the fourth node (node 4). The fourth signal (signal 4) output from the second multiplex output terminal 216 may be input to the capacitor unit 300 through the fourth node (node 4).

The first and second multiplex input terminals 211 and 212 may be selected by the slew rate control signal SRCS in the second mode (mode 2). In this case, the first signal (signal 1) may be output from the first multiplex output terminal 215, and the second signal (signal 2) may be output from the second multiplex output terminal 216. In other words, the third signal (signal 3) may be the first signal (signal 1) in the second mode (mode 2), and the fourth signal (signal 4) may be the second signal (signal 2) in the second mode (mode 2). However, the present inventive concepts are not limited thereto.

For example, in the second mode (mode 2), the signal output through the first multiplex output terminal 215 may be a signal having the same phase as the first signal (signal 1). Further, in the second mode (mode 2), the signal output through the second multiplex output terminal 216 may be a signal having the same phase as the second signal (signal 2). That is, the signal output from the second multiplex output terminal 216 may be a signal having an opposite phase to the signal output from the first multiplex output terminal 215.

The third and fourth multiplex input terminals 213 and 214 may be selected by the slew rate control signal SRCS in the first mode (mode 1). In this case, the second signal (signal 2) may be output from the first multiplex output terminal 215, and the first signal (signal 1) may be output from the second multiplex output terminal 216. In other words, the third signal (signal 3) may be the second signal (signal 2), and the fourth signal (signal 4) may be the first signal (signal 1). However, the present inventive concepts are not limited thereto.

For example, in the first mode (mode 1), the signal output through the first multiplex output terminal 215 may be a signal having the same phase as the second signal (signal 2). Further, in the first mode (mode 1), the signal output through the second multiplex output terminal 216 may be a signal having the same phase as the first signal (signal 1).

Figure 4:
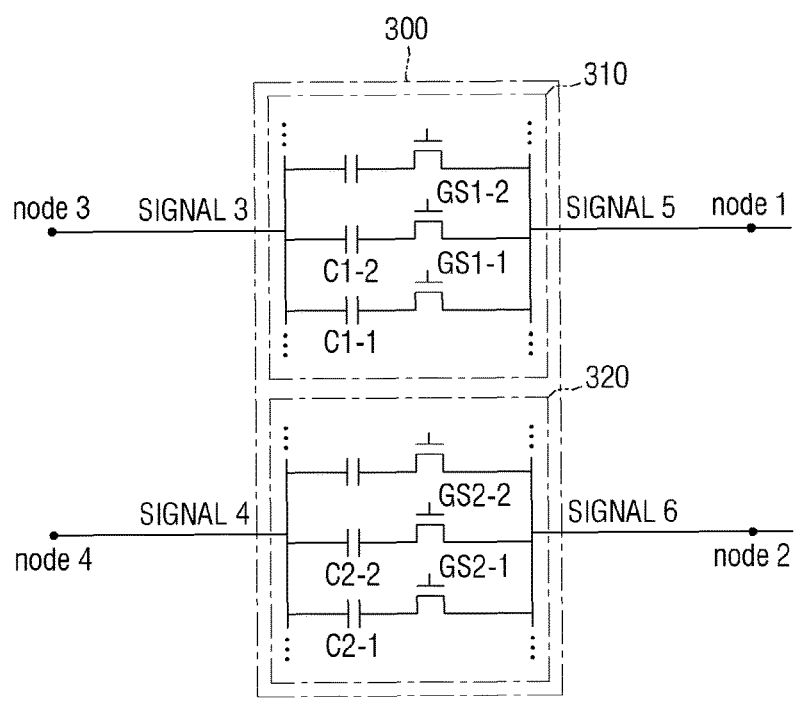
FIGS. 4 to 6 are diagrams showing capacitor units according to some embodiments of the inventive concepts.
Figure 5:
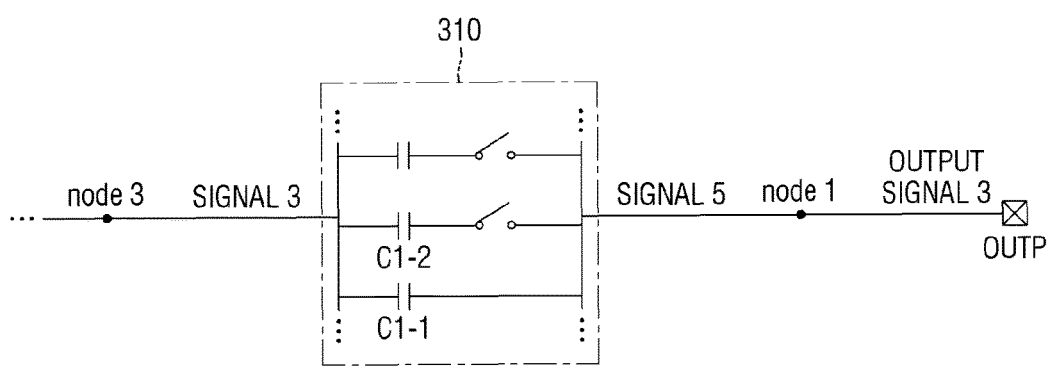
Figure 6:
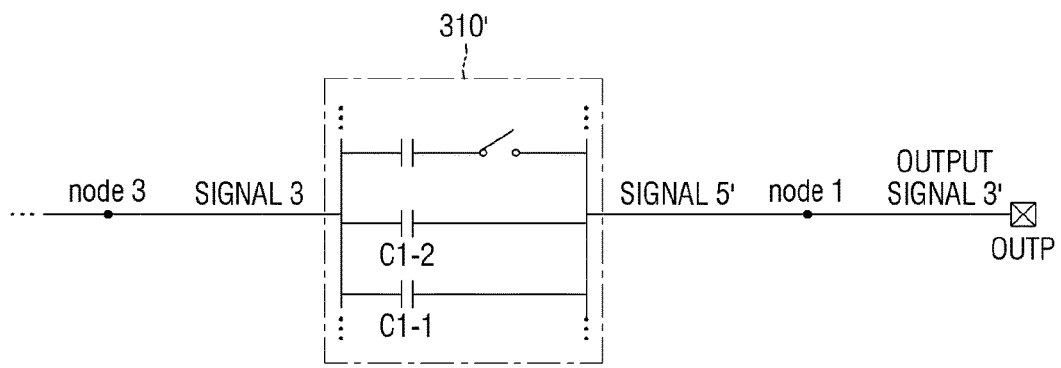

FIGS. 4 to 6 are diagrams showing capacitor units according to some embodiments of the present inventive concepts.

Referring to FIGS. 3 and 4, the capacitor unit 300 may include a first capacitor unit 310 and a second capacitor unit 320.

The first capacitor unit 310 may be disposed between the third node (node 3) and the first node (node 1). Therefore, the first capacitor unit 310 may receive the third signal (signal 3) which is output by the phase selection unit 200. Further, the fifth signal (signal 5), which is an output of the first capacitor unit 310, may be output to the first node (node 1).

The first capacitor unit 310 may include a plurality of third capacitors connected in parallel with each other between the phase selection unit 200 and the first output terminal OUTP. The plurality of third capacitors may, for example, include a capacitor C1-1 and a capacitor C1-2 connected in parallel with each other. In the embodiments illustrated in FIG. 4, the first capacitor unit 310 includes three capacitors. However, this is for convenience, and the inventive concepts are not limited thereto. For example, the plurality of third capacitors may include a larger or smaller number of capacitors.

Further, for example, the first capacitor unit 310 may include a plurality of switches respectively connected in series with the plurality of third capacitors. The plurality of switches may be connected in parallel with each other between the phase selection unit 200 and the first output terminal OUTP. For example, one end of the capacitor C1-1 may be directly with the third node (node 3), and the other end thereof may be directly with a switch GS1-1. In the embodiments illustrated in FIG. 4, the plurality of switches are transistors, but the present inventive concepts are not limited thereto. For example, a plurality of switches may be any arrangement that is configured to selectively connect the plurality of third capacitors between the third node (node 3) and the first node (node 1).

The third signal (signal 3) input to the first capacitor unit 310 may pass through at least one of the plurality of third capacitors. In other words, the first capacitor unit 310 connected with the phase selection unit 200 may pass the third signal (signal 3) through at least one of the plurality of third capacitors, so as to output the third signal (signal 3) as the fifth signal (signal 5). Here, at least one of the plurality of third capacitors may be a capacitor connected between the third node (node 3) and the first node (node 1).

However, the inventive concepts are not limited thereto. For example, all of the plurality of switches included in the first capacitor unit 310 may turn off. In this case, the third signal (signal 3) may not be input to the first node (node 1) through the first capacitor unit 310. Therefore, the first output signal (output signal 1) may be substantially the same as the third output signal 3 (output signal 3).

The second capacitor unit 320 may be disposed between the fourth node (node 4) and the second node (node 2). Therefore, the second capacitor unit 320 may receive the fourth signal (signal 4) that is output by the phase selection unit 200. Further, the sixth signal (signal 6), which is an output of the second capacitor unit 320, may be output to the second node (node 2).

The second capacitor unit 320 may include a plurality of fourth capacitors connected in parallel with each other between the phase selection unit 200 and the second output terminal OUTN. The plurality of fourth capacitors, for example, may include a capacitor C2-1 and a capacitor C2-2 connected in parallel with each other. in the embodiments shown in FIG. 4, the plurality of fourth capacitors includes three capacitors. However, this is for convenience, and the inventive concepts are not limited thereto. For example, the plurality of fourth capacitors may include a larger or smaller number of capacitors.

Further, for example, the second capacitor unit 320, similarly to the first capacitor unit 310, may include a plurality of switches that are respectively connected in series with the plurality of fourth capacitors. The plurality of switches may be connected in parallel with each other between the phase selection unit 200 and the second output terminal OUTN. For example, one end of the capacitor C2-1 may be directly with the fourth node (node 4), and the other end thereof may be connected directly with a switch GS2-1. In the embodiments shown in FIG. 4, the plurality of switches are transistors, but the inventive concepts are not limited thereto. For example, the plurality of switches may include any arrangement that is configured to selectively connect the plurality of fourth capacitors between the fourth node (node 4) and the second node (node 2).

The fourth signal (signal 4) input to the second capacitor unit 320 may pass through at least one of the plurality of fourth capacitors. In other words, the second capacitor unit 320 connected with the phase selection unit 200 may pass the fourth signal (signal 4) through at least one of the plurality of fourth capacitors, so as to output the fourth signal (signal 4) as the sixth signal (signal 6). Here, at least one of the plurality of fourth capacitors may be a capacitor connected between the fourth node (node 4) and the second node (node 2).

However, the inventive concepts are not limited thereto. For example, all of the plurality of switches included in the second capacitor unit 320 may be turned off. In this case, the fourth signal (signal 4) may not be input to the second node (node 2) through the second capacitor unit 320. Therefore, the second output signal (output signal 2) may be substantially the same as the fourth output signal (output signal 4).

Moreover, the inventive concepts are not limited to the arrangement of capacitors shown in FIG. 4. For example, the first capacitor unit 310 and/or the second capacitor unit 320 may include one or more capacitors connected in a capacitor network including series and/or parallel connections.

Referring to FIGS. 3 to 6, since the first capacitor unit 310 is provided with a plurality of switches, the first capacitor unit 310 may connect one or more of the plurality of third capacitors between the phase selection unit 200 and the first output terminal OUTP. Further, since the second capacitor unit 320 is provided with a plurality of switches, the second capacitor unit 320 may connect one or more of the plurality of fourth capacitors between the phase selection unit 200 and the second output terminal OUTN.

For example, in the first capacitor unit 310 of FIG. 5, only the capacitor C1-1 of the plurality of third capacitors may be connected between the third node (node 3) and the first node (node 1), and others of the plurality of third capacitors may not be connected therebetween. Further, for example, in the first capacitor unit 310' of FIG. 6, only the capacitors C1-1 and C1-2 of the plurality of third capacitors may be connected between the third node (node 3) and the first node (node 1), and others of the plurality of third capacitors may not be connected therebetween. Even in the second capacitor unit 320, similarly to the first capacitor unit 310, at least some of the plurality of fourth capacitors may be connected between the fourth node (node 4) and the second node (node 2).

The first capacitor unit 310 is connected to the first output terminal OUTP to control the increment or decrement of the slew rate of the first output signal (output signal 1) depending on a first capacitance. In this case, the slew rate of the first output signal (output signal 1) may be controlled by adding the first output signal (output signal 1) to the fifth signal (signal 5) at the first node (node 1). The first capacitance may depend on the number of capacitors connected between the phase selection unit 200 and the first output terminal OUTP, among the plurality of third capacitors. For example, in the case of FIG. 5, the first capacitance may have the same value as the capacitance of the capacitor C1-1. Further, for example, in the case of FIG. 6, the first capacitance may have the same value as the sum of the capacitance of the capacitor C1-1 and the capacitance of the capacitor C1-2.

The second capacitor unit 320 is connected to the second output terminal OUTN to control the increment or decrement of the slew rate of the second output signal (output signal 2) depending on a second capacitance. In this case, the slew rate of the second output signal (output signal 2) may be controlled by adding the second output signal (output signal 2) to the sixth signal (signal 6) at the second node (node 2). The second capacitance may depend on the number of capacitors connected between the phase selection unit 200 and the second output terminal OUTN, among the plurality of fourth capacitors.

The slew rates of the first output signal (output signal 1) and second output signal (output signal 2), which comprise a differential signal pair, may be controlled at the same time. For example, when the first and second capacitance values are equal to each other, the slew rates of the first output signal (output signal 1 and second output signal (output signal 2) may be increased or decreased by the same amount.

Figure 7:
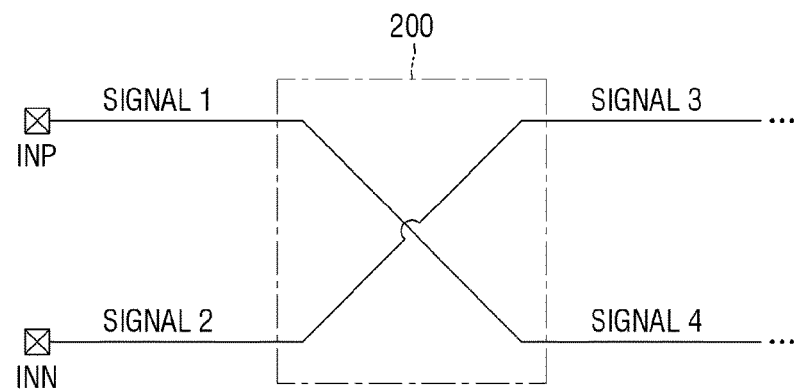
FIG. 7 is a diagram showing a phase selection unit in a first mode according to an embodiment of the inventive concepts.
Figure 8:
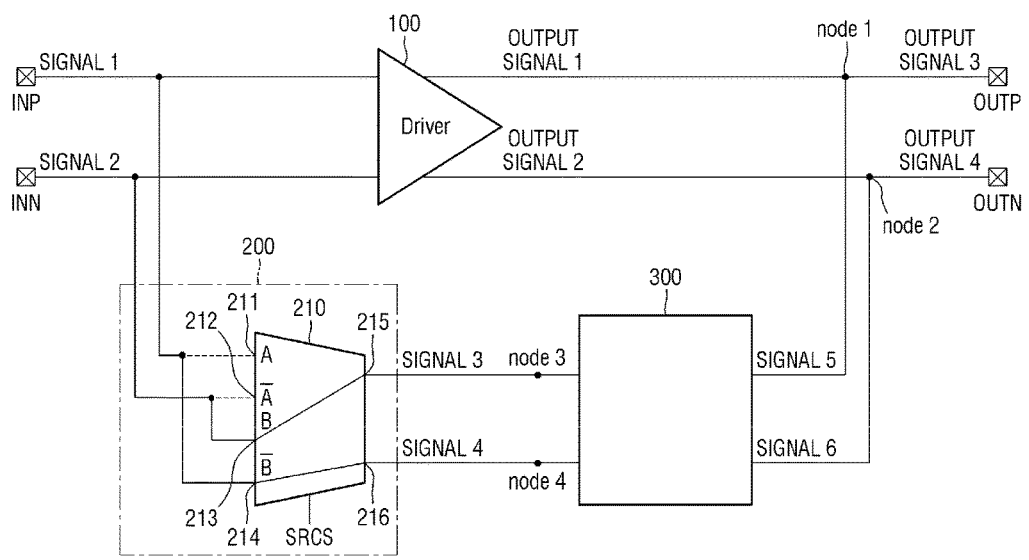
FIG. 8 is a diagram showing the connection relationship of a phase selection unit of an integrated circuit in a first mode according to an embodiment of the inventive concepts.
Figure 9:
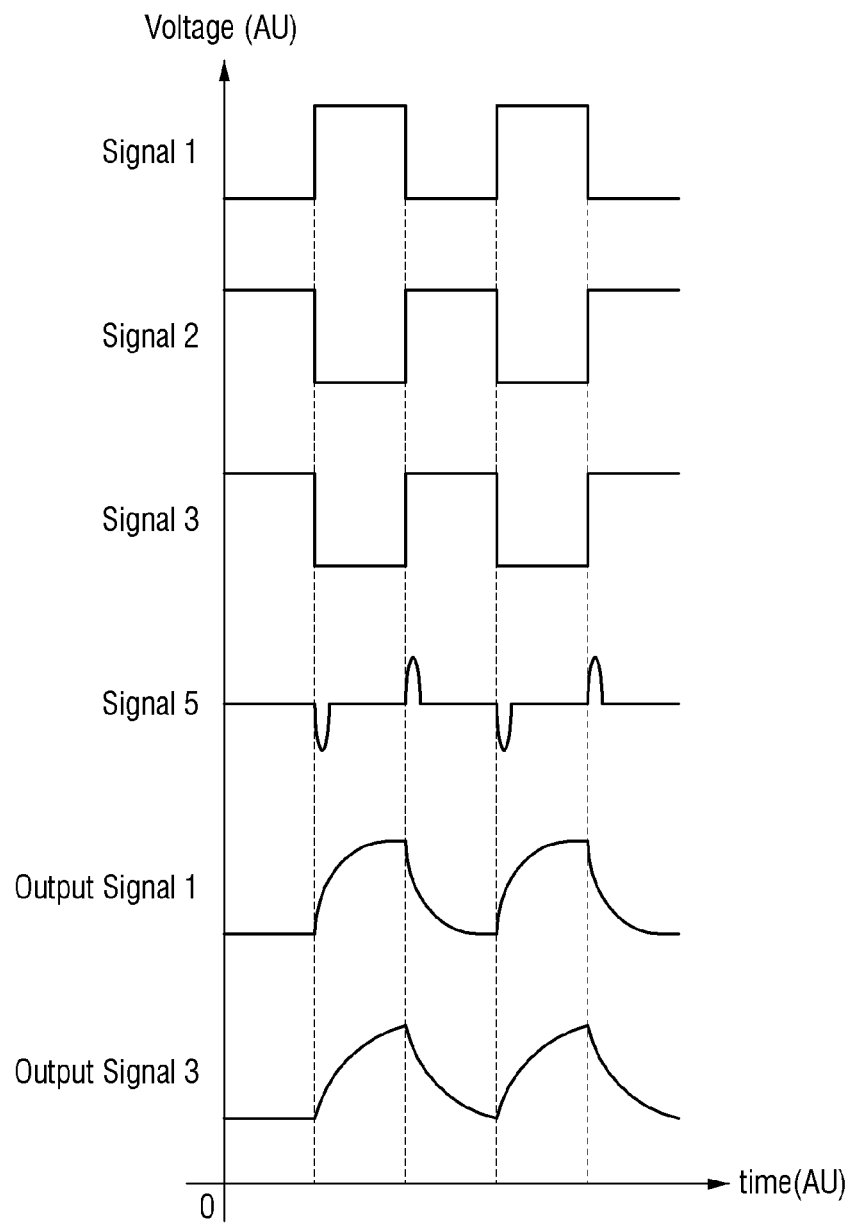
FIG. 9 is a graph showing the signals at each node or each terminal of FIG. 2 in a first mode.
Figure 10:
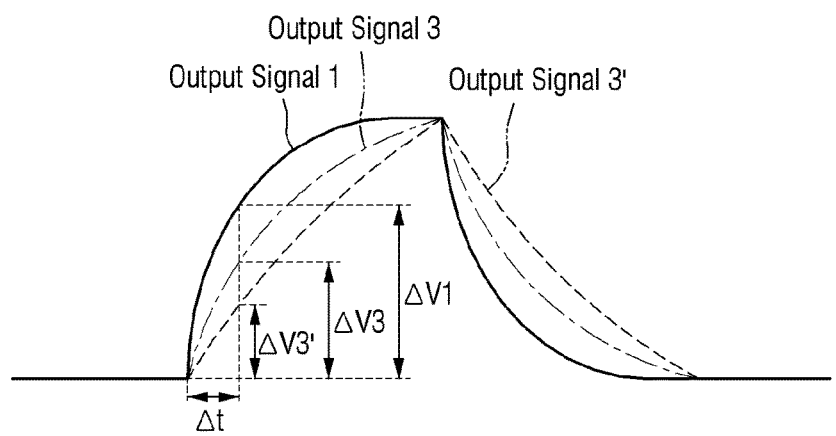
FIG. 10 is a graph showing the output signals of an integrated circuit in a first mode according to an embodiment of the inventive concepts.

FIG. 7 is a diagram showing a phase selection unit in a first mode according to some embodiments of the inventive concepts. FIG. 8 is a diagram showing the connection relationship of a phase selection unit of an integrated circuit in a first mode according to some embodiments of the inventive concepts. FIG. 9 is a graph showing the signals at each node or each terminal of FIG. 2 in a first mode, where the relationship of voltage [V] to time [AU] in the first mode is shown with respect to each signal. FIG. 10 is a graph showing the output signals of an integrated circuit in a first mode according to some embodiments of the inventive concepts, where the relationships of voltage [V] to time [AU] are shown.

FIG. 9 illustrates that the slew rates of output signals of a driver can be reduced by adding to the output signals of the driver signals having a phase that is opposite to the phase of the output signals of the driver. In this case, the slew rates of the output signals of the driver can be controlled by using capacitors having relatively low capacitance values.

Referring to FIGS. 1 to 9, in the first mode (mode 1), the phase selection unit 200 receives the first signal (signal 1) and provides this first signal (signal 1) to the second capacitor unit 320, and receives the second signal (signal 2) and provides this second signal (signal 2) to the first capacitor unit 310. In other words, in the first mode (mode 1), the fourth signal (signal 4) output to the fourth node (node 4) may be the first signal (signal 1), and the third signal (signal 3) output to the third node (node 3) may be the second signal (signal 2).

Specifically, the slew rate control signal (SRCS) may cause the multiplexer 210 to select the first mode (mode 1). That is, the third and fourth multiplex input terminals 213 and 214 may be selected. Accordingly, the third multiplex input terminal 213 may be connected with the first multiplex output terminal 215, and the fourth multiplex input terminal 214 may be connected with the second multiplex output terminal 216. Therefore, the second signal (signal 2) applied to the third multiplex input terminal 213 may be output to the first multiplex output terminal 215. Further, the first signal (signal 1) applied to the fourth multiplex input terminal 214 may be output to the second multiplex output terminal 216. That is, as shown in FIG. 9, in the first mode (mode 1), the third signal (signal 3) may have the same phase as the second signal (signal 2) having an opposite phase to the first signal (signal 1).

The third signal (signal 3) input to the capacitor unit 300 may pass through the first capacitor unit 310 and then be output as the fifth signal (signal 5). As shown in FIG. 9, the fifth signal (signal 5) is a signal obtained by passing the third signal (signal 3) through the first capacitor unit 310. That is, the third signal (signal 3) may be filtered by the first capacitor unit 310 acting as a high-pass filter to generate the fifth signal (signal 5). The third signal (signal 3) may include both direct current and alternating current components, whereas the fifth signal (signal 5), having passed through the first capacitor unit 310, may include only an alternating current component.

The first output signal (output signal 1), which is a signal corresponding to the first signal (signal 1), may have predetermined delay or attenuation, compared to the first signal (signal 1).

The first output signal (output signal 1) may be added to the fifth signal (signal 5) at the first node (node 1). The fifth signal (signal 5) may have an opposite phase to the first signal (signal 1). Further, when the amplitude of the first output signal (output signal 1) increases from the minimum value to the maximum value, the amplitude of the fifth signal (signal 5) may temporarily decrease.

Accordingly, when the first output signal (output signal 1) is added to the fifth signal (signal 5), as shown in the graph of the third output signal (output signal 3) of FIG. 10, the slew rate thereof may decrease, compared to the first output signal (output signal 1). Here, the third output signal (output signal 3) may be a signal output to the first output terminal OUTP after the first output signal (output signal 1) is added to the fifth signal (signal 5) at the first node (node 1). Consequently, the third output signal 3 may be obtained by decreasing the slew rate of the first output signal (output signal 1).

Specifically, when unit time is $\Delta t$, the amplitude change of the first output signal (output signal 1) is $\Delta V1$, and the amplitude change of the third output signal (output signal 3) is $\Delta V3$. In the graph of FIG. 10, $\Delta V1$ is greater than $\Delta V3$. Since the slew rate is a value obtained by dividing the amplitude change by the unit time, the slew rate may be proportional to the amplitude change. Therefore, in the case of the first mode (mode 1), the slew rate of the first output signal (output signal 1) is higher than the slew rate of the third output signal (output signal 3). Consequently, the third output signal (output signal 3), which is obtained by decreasing the slew rate of the first output signal (output signal 1), may be output to the first output terminal OUTP.

In the first mode (mode 1), since the fourth signal (signal 4) have the same phase as the first signal (signal 1) (that is, an opposite phase to the second signal (signal 2)), the waveform of the fourth signal (signal 4) may be vertically symmetrical to the waveform of the third signal (signal 3). The fourth signal (signal 4) input to the capacitor unit 300 passes through the second capacitor unit 320 and is then output as the sixth signal (signal 6). The waveform of the sixth signal (signal 6) may be vertically symmetrical to the waveform of the fifth signal (signal 5). The second output signal (output signal 2), which is a signal corresponding to the second signal (signal 2), may be vertically symmetrical to the waveform of the first output signal (output signal 1). Therefore, when the second output signal (output signal 2) is added to the sixth signal (signal 6) at the second node (node 2), the slew rate of the second output signal (output signal 2) may decrease. That is, the fourth output signal (output signal 4) input to the second output terminal OUTN may be obtained by decreasing the slew rate of the second output signal (output signal 2).

Meanwhile, in the first mode (mode 1), as the aforementioned first and second capacitances increase, the slew rate of the first output signal (output signal 1) may further decrease. Hereinafter, the first capacitor unit 310 (refer to FIG. 5) in which only the capacitor C1-1 is connected in parallel between the third node (node 3) and the first node (node 1) will be compared with the first capacitor unit 310' (refer to FIG. 6) in which the and capacitors C1-1 and C1-2 are connected in parallel between the third node (node 3) and the first node (node 1).

In the graph of the third output signal (output signal 3) of FIG. 10, in the first mode (mode 1), the third output signal (output signal 3) (refer to FIG. 5) may be obtained by adding the fifth signal (signal 5) to the first output signal (output signal 1) at the first node (node 1). In the first mode (mode 1), the third output signal (output signal 3') (refer to FIG. 6) may be obtained by adding the fifth signal (signal 5') to the first output signal (output signal 1) at the first node (node 1).

In the graph of FIG. 10, since both the third output signal (output signal 3) and the third output signal (output signal 3') are signals generated in the first mode (mode 1), it can be seen that each of the third output signal (output signal 3) and the third output signal (output signal 3') has a slew rate lower than the slew rate of the first output signal (output signal 1).

However, the slew rate of the third output signal (output signal 3) may be higher than the slew rate of the third output signal (output signal 3'). Specifically, the voltage change of the third output signal (output signal 3) per unit time $\Delta t$ may be $\Delta V3$, and the voltage change of the third output signal (output signal 3') per unit time $\Delta t$ may be $\Delta V3'$. In the graph of FIG. 10, $\Delta V3$ is greater than $\Delta V3'$. Therefore, in the case of FIG. 6 where a larger number of capacitors are connected in parallel between the third node (node 3) and the first node (node 1), the slew rate may further decrease, compared to the case of FIG. 5.

Figure 11:
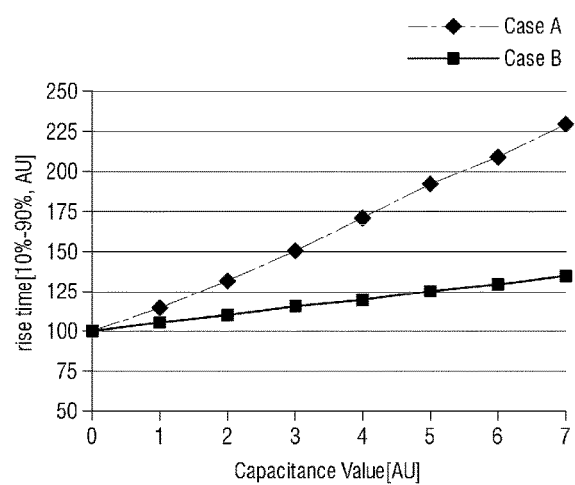
FIGS. 11 to 13 are views for explaining the effects of integrated circuits according to some embodiments of the inventive concepts.
Figure 12:
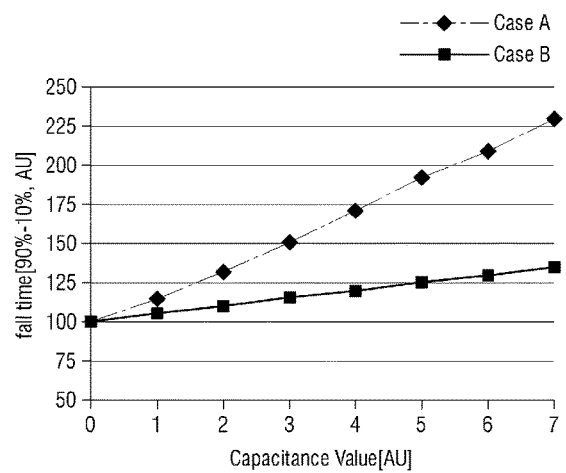
Figure 13:
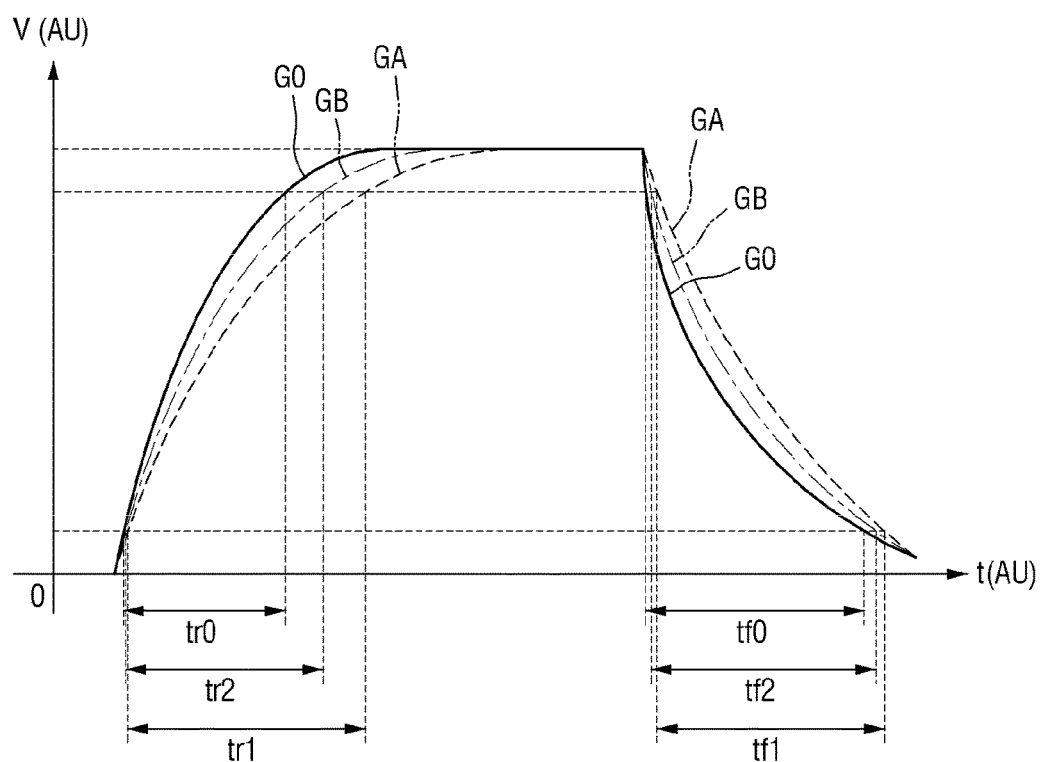

FIGS. 11 to 13 are views that illustrate the operation of integrated circuits according to some embodiments of the inventive concepts. FIGS. 11A to 12B are views comparing a first case (case A) and a second case (case B) in the first mode (mode 1). In the first case (case A), the phase selection unit 200 of the integrated circuit according to the inventive concepts selects the first mode (mode 1). In the second case (case B), in order to decrease the slew rate of an output signal, capacitors are connected such that one end of each capacitor is directly connected with the output terminal of a driver and the other end of which is directly connected with a ground voltage (for example, about 0V). That is, in the second case (case B), the capacitors are not connected in parallel with the driver.

FIG. 11A is a graph showing the results of measuring rise time depending on the capacitance value (in arbitrary units, AU) in the first case (case A) and the second case (case B). Here, the rise time may be time from 10% to 90% of maximum value during a period in which a pulse wave increases from the minimum value to the maximum value. This means that the time taken to reach from the minimum value to the maximum value increases as the rise time in the graph increases.

FIG. 11B is a graph showing the results of measuring rise time depending on the capacitance value [AU] in the first case (case A) and the second case (case B), where this graph is a graph corresponding to FIG. 11A.

FIG. 12A is a graph showing the results of measuring fall time depending on the capacitance value [AU] in the first case (case A) and the second case (case B). Here, the fall time may be time from 90% to 10% of maximum value during a period in which a pulse wave increases from the maximum value to the minimum value. This means that the time taken to reach from the maximum value to the minimum value increases as the fall time in the graph increases.

FIG. 12B is a graph showing the results of measuring fall time depending on the capacitance value [AU] in the first case (case A) and the second case (case B), where this graph is a graph corresponding to FIG. 12A.

FIG. 13 is a graph showing the graph GA of the first case (case A) and the graph GB of the second case (case B) when the capacitance value [AU] is 5 in the first mode (mode 1). Each of the graphs GA and GB is represented by the voltage (V[AU]) over time (t[AU]).

The capacitance value [AU] is any capacitance value of a capacitor. When the capacitance value [AU] is 0, a capacitor is not connected to the output terminal of a driver. When the capacitance value [AU] is 1, it may be x[pF], and when the capacitance value [AU] is 2, it may be 2×[pF]. That is, the capacitance value of a capacitor also increases as the capacitance value [AU] increases.

In the first case (case A), for example, when the capacitance value [AU] is 2, a case such as shown in FIG. 5 in which only one of the plurality of capacitors is connected may be exemplified. Similarly, when the capacitance value [AU] is 3, a case such as shown in FIG. 6 in which more than one of the plurality of capacitors is connected may be exemplified.

In the second case (case B), when the capacitance value [AU] is 2, for example, there may be exemplified a case where a capacitor having the same capacitance as the capacitance of the first capacitor unit 310 (for example, the capacitance of the capacitor C1-1) is connected between the output terminal of a driver and a ground voltage. In the second case (case B), when the capacitance value [AU] is 3, for example, there may be exemplified a case where a capacitor having the same capacitance as the capacitance of the first capacitor unit 310' (for example, the sum of the capacitance of the capacitor C1-1 and the capacitance of the capacitor C1-2) is connected to the output terminal of a driver and a ground voltage.

The graph G0 of FIG. 13 may be a graph when the capacitance value [AU] is 0, that is, when the slew rate of the output signal of a driver is not controlled. In the graph G0, rise time may be tr0 (for example, 100.5[AU]), and fall time may be tf0 (for example, 100.5[AU]).

Referring to FIGS. 2 to 13, when the capacitance value [AU] is 5 in the first mode (mode 1), the rise time in the first case (case A) may be tr1 (for example, 192.1[AU]), and the rise time in the second case (case B) may be tr2 (for example, 125.5[AU]. Here, tr1 may be greater than tr2. Compared to when the capacitance value [AU] is 0, the difference (for example, about 91.6[AU]) between tr1 and tr2 may be greater than the difference (for example, about 25.0[AU]) between tr2 and tr0. This means that, in the same capacitance value (AU), the slew rate of the output signal in the first case (case A) decreases further compared to the slew rate of the output signal in the second case (case B). That is, a longer rise time corresponds to a lower slew rate.

Meanwhile, when the capacitance value [AU] is 5 in the first mode (mode 1), the fall time in the first case (case A) may be tf1 (for example, 191.4[AU]), and the fall time in the second case (case B) may be tf2 (for example, 125.5[AU]. Here, tf1 may be greater than tf2. Compared to when the capacitance value [AU] is 0, the difference (for example, about 90.9[AU]) between tf1 and tf0 may be greater than the difference (for example, about 25.0[AU]) between tf2 and tf0. This means that, in the same capacitance value (AU), the slew rate of the output signal in the first case (case A) decreases further compared to the slew rate of the output signal in the second case (case B), because a longer fall time corresponds to a lower slew rate.

If capacitors having the same capacitance values are used, when the slew rates of the output signals of the differential signal driver 100 are controlled by connecting a slew rate control unit in parallel with the differential signal driver 100 and controlling the phases of the signals (for example, the fifth signal (signal 5) and the sixth signal (signal 6)) added to the output signals (for example, the first output signal (output signal 1) and the second output signal (output signal 2)), the slew rates of the output signals can be further effectively increased and/or decreased.

An integrated circuit according to the inventive concepts can decrease the slew rates of output signals of a driver by adding to the output signals of the driver signals having a phase that is opposite to the phase of the output signals of the driver. In this case, the slew rates of the output signals of the driver can be controlled by using capacitors having relatively low capacitance values, so as to improve the degree of integration of the integrated circuit.

Figure 14:
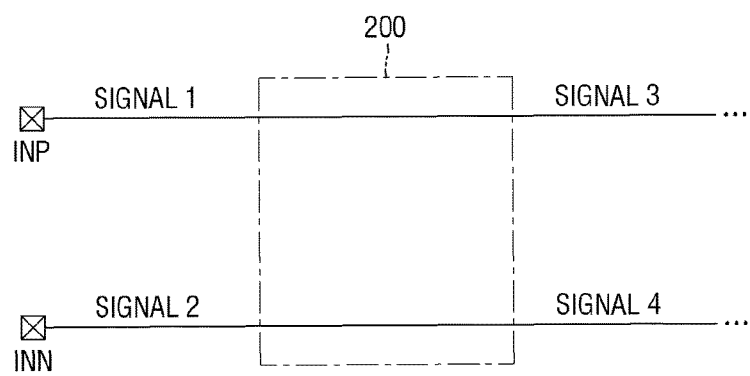
FIG. 14 is a diagram showing a phase selection unit in a second mode according to an embodiment of the inventive concepts.
Figure 15:
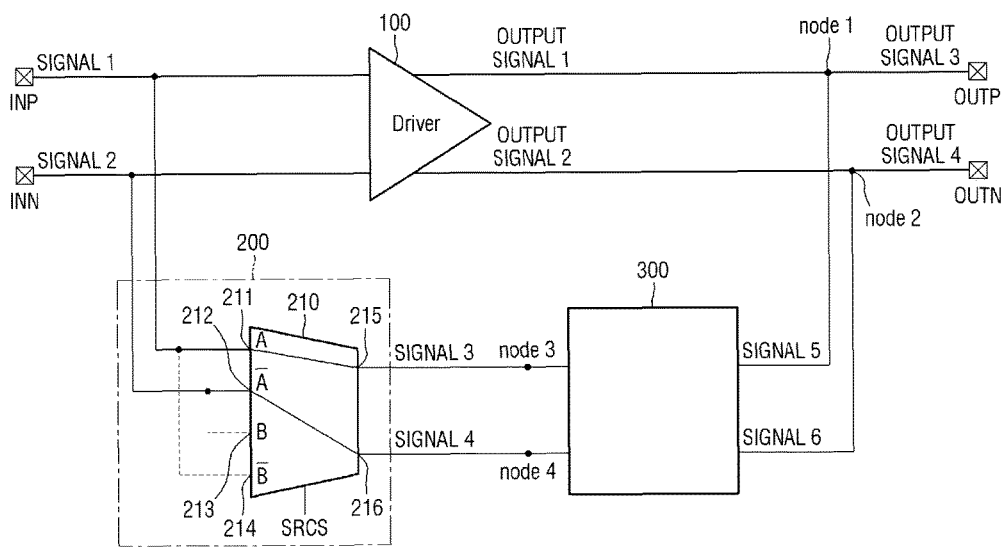
FIG. 15 is a diagram showing the connection relationship of a phase selection unit of an integrated circuit in a second mode according to an embodiment of the inventive concepts.
Figure 16:
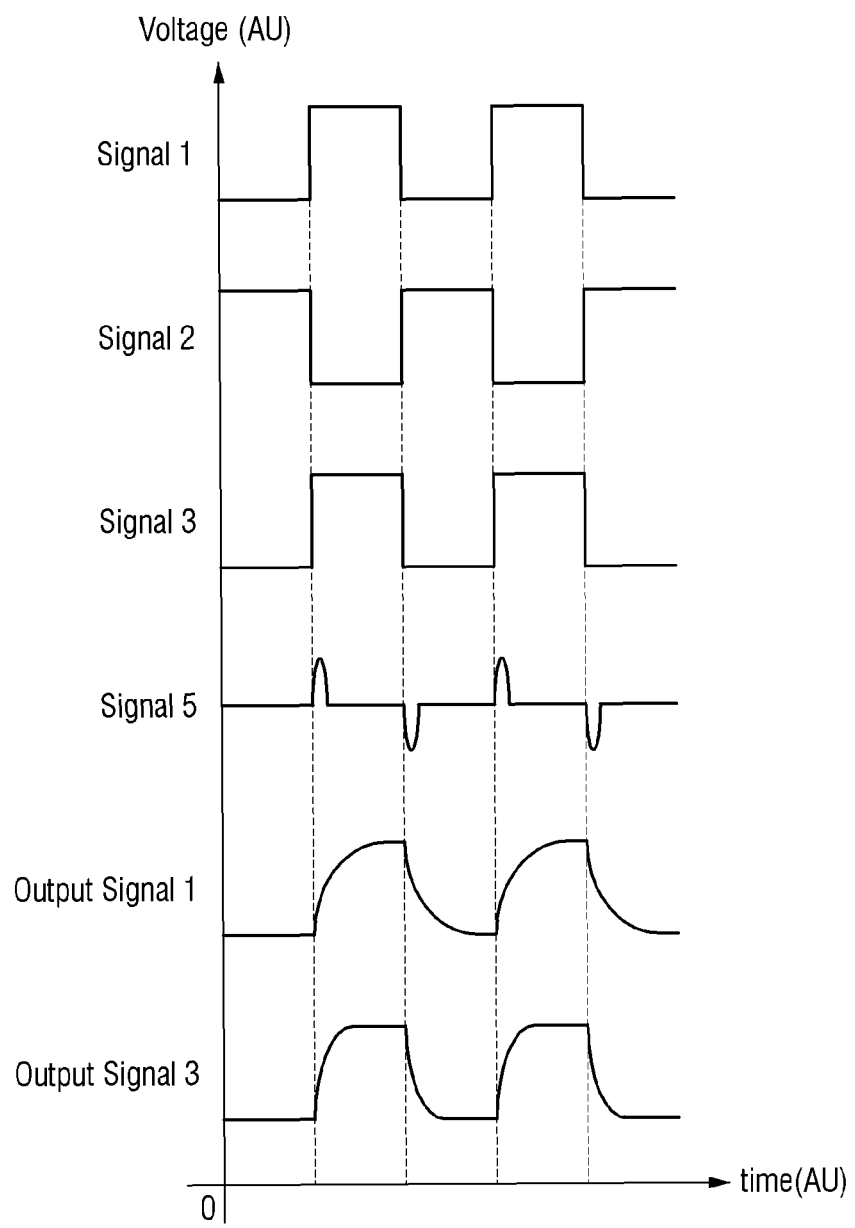
FIG. 16 is a graph showing the signals at each node or each terminal of FIG. 2 in a second mode.
Figure 17:
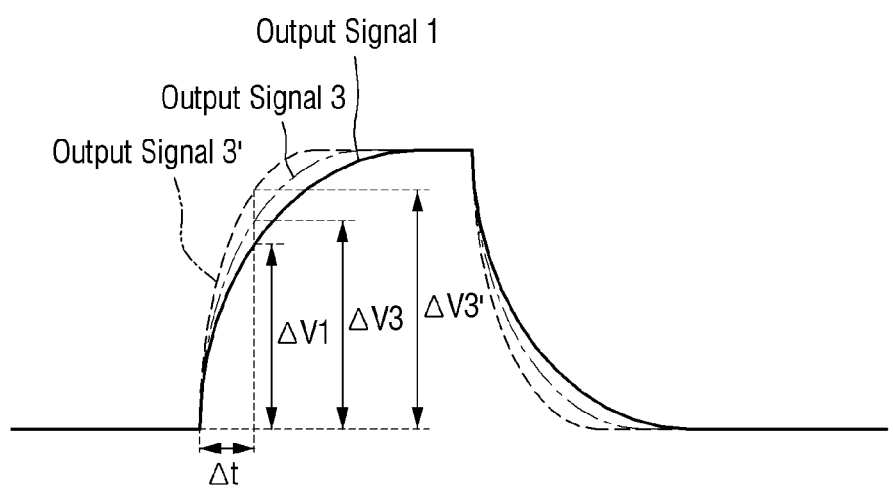
FIG. 17 is a graph showing the output signals of an integrated circuit in a second mode according to an embodiment of the inventive concepts, which is a graph showing the relationship of a voltage over time.

FIG. 14 is a diagram showing a phase selection unit in a second mode according to some embodiments of the inventive concepts. FIG. 15 is a diagram showing the connection relationship of a phase selection unit of an integrated circuit in a second mode according to some embodiments of the inventive concepts. FIG. 16 is a graph showing the signals at each node or each terminal of FIG. 2 in a second mode. FIG. 17 is a graph showing the output signals of an integrated circuit in a second mode according to embodiments of the inventive concepts, which is a graph showing the relationship of a voltage over time.

Referring to FIGS. 3 to 6 and 14 to 17, in the second mode (mode 2), the phase selection unit 200 receives the first signal (signal 1) and provides this first signal (signal 1) to the first capacitor unit 310, and receives the second signal (signal 2) and provides this second signal (signal 2) to the second capacitor unit 320. In other words, in the second mode (mode 2), the third signal (signal 3) output to the third node (node 3) may be the first signal (signal 1), and the fourth signal (signal 4) output to the fourth node (node 4) may be the second signal (signal 2).

The slew rate control signal (SRCS) may cause the multiplexer 210 to select the second mode (mode 2). That is, the first and second multiplex input terminals 211 and 212 may be selected. Accordingly, the first multiplex input terminal 211 may be connected with the first multiplex output terminal 215, and the second multiplex input terminal 212 may be connected with the second multiplex output terminal 216. Therefore, the first signal (signal 1) applied to the first multiplex input terminal 211 may be output to the first multiplex output terminal 215. Further, the second signal (signal 2) applied to the second multiplex input terminal 212 may be output to the second multiplex output terminal 216. In other words, as shown in FIG. 16, in the second mode (mode 2), the third signal (signal 3) may have the same phase as the first signal (signal 1).

The third signal (signal 3) input to the capacitor unit 300 may pass through the first capacitor unit 310 and then output as the fifth signal (signal 5). As shown in FIG. 16, the fifth signal (signal 5) is a signal obtained by passing the third signal (signal 3) through the first capacitor unit 310. The third signal (signal 3) may include both direct current and alternating current components, whereas the third signal (signal 3), having passed through the first capacitor unit 310, may include only an alternating current component.

The first output signal (output signal 1), which is a signal corresponding to the first signal (signal 1), may cause predetermined delay or attenuation, compared to the first signal (signal 1).

The first output signal (output signal 1) may be added to the fifth signal (signal 5) at the first node (node 1). The fifth signal (signal 5) may have the same phase as the first signal (signal 1). Further, when the amplitude of the first output signal (output signal 1) increases from the minimum value to the maximum value, the amplitude of the fifth signal (signal 5) may temporarily increase.

Accordingly, when the first output signal (output signal 1) is added to the fifth signal (signal 5), as shown in the graph of the third output signal (output signal 3) of FIG. 17, the slew rate thereof may increase, compared to the first output signal (output signal 1). Here, the third output signal (output signal 3) may be a signal output to the first output terminal OUTP after the first output signal (output signal 1) is added to the fifth signal (signal 5) at the first node (node 1). Consequently, the third output signal 3 may be a signal obtained by increasing the slew rate of the first output signal (output signal 1).

Specifically, as shown in the graph of FIG. 17, when unit time is $\Delta t$, the amplitude change of the first output signal (output signal 1) is $\Delta V1$, and the amplitude change of the third output signal (output signal 3) is $\Delta V3$. In the graph of FIG. 17, $\Delta V1$ is smaller than $\Delta V3$. Since the slew rate is a value obtained by dividing the amplitude change by the unit time, the slew rate may be proportional to the amplitude change. Therefore, in the case of the second mode (mode 2), the slew rate of the first output signal (output signal 1) is lower than the slew rate of the third output signal (output signal 3). Consequently, the third output signal (output signal 3), which is obtained by increasing the slew rate of the first output signal (output signal 1), may be output to the first output terminal OUTP.

In the second mode (mode 2), since the fourth signal (signal 4) has the same phase as the second signal (signal 2), the waveform of the fourth signal (signal 4) may be vertically symmetrical to the waveform of the third signal (signal 3). The fourth signal (signal 4) input to the capacitor unit 300 passes through the second capacitor unit 320 and then output as the sixth signal (signal 6). The waveform of the sixth signal (signal 6) may be vertically symmetrical to the waveform of the fifth signal (signal 5). The second output signal (output signal 2), which is a signal corresponding to the second signal (signal 2), may be vertically symmetrical to the waveform of the first output signal (output signal 1). Therefore, when the second output signal (output signal 2) is added to the sixth signal (signal 6) at the second node (node 2), the slew rate of the second output signal (output signal 2) may increase. That is, the fourth output signal (output signal 4) input to the second output terminal OUTN may be obtained by increasing the slew rate of the second output signal (output signal 2).

Meanwhile, in the second mode (mode 2), as the aforementioned first and second capacitances increase, the slew rate of the first output signal (output signal 1) may further increase. Hereinafter, contents overlapping the above description of the first mode (mode 1) will be omitted, and only differences will be described with reference to FIGS. 5, 6, and 10.

In the graph of FIG. 17, since both the third output signal (output signal 3) and the third output signal (output signal 3') are signals generated in the second mode (mode 2), it can be seen that each of the third output signal (output signal 3) and the third output signal (output signal 3') has a slew rate higher than the slew rate of the first output signal (output signal 1).

However, the slew rate of the third output signal (output signal 3) may be lower than the slew rate of the third output signal (output signal 3'). Specifically, the voltage change of the third output signal (output signal 3) per unit time $\Delta t$ may be ΔV3, and the voltage change of the third output signal (output signal 3') per unit time Δt may be ΔV3'. In the graph of FIG. 17, ΔV3 is smaller than ΔV3'. Therefore, in the case of FIG. 6 where a larger number of capacitors are connected in parallel between the third node (node 3) and the first node (node 1), the slew rate may further increase, compared to in the case of FIG. 5.

An integrated circuit according to the inventive concepts can increase the slew rates of output signals of a driver by adding to the output signals of the driver signals having the same phase as the output signals of the driver. Further, when signals having an opposite phase to the output signals of the driver are added to the output signals of the driver, the slew rates of the output signals of the driver, and thus the slew rates of the output signals of the driver can be selectively controlled depending on the specifications of various devices or components.

While the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. An integrated circuit, comprising:
    a differential signal driver configured to receive a first signal from a first input terminal, to receive a second signal, which is a differential signal of the first signal, from a second input terminal, to output a first output signal corresponding to the first signal to a first output terminal, and to output a second output signal corresponding to the second signal to a second output terminal;
    a first capacitor unit connected to the first output terminal and configured to alter a slew rate of the first output signal based on a first capacitance of the first capacitor unit;
    a second capacitor unit connected to the second output terminal and configured to alter a slew rate of the second output signal based on a second capacitance of the second capacitor unit; and
    a phase selection unit configured, in a first mode, to receive the first signal and provide the first signal to the second capacitor unit, and to receive the second signal and provide the second signal to the first capacitor unit, so as to decrease the slew rates of the first and second output signals.

2. The integrated circuit of claim 1, wherein the phase selection unit is configured to decrease the slew rates of the first and second output signals simultaneously.

3. The integrated circuit of claim 1, wherein the phase selection unit is configured, in a second mode, to receive the first signal and provide the first signal to the first capacitor unit, and to receive the second signal and provide the second signal to the second capacitor unit, so as to increase the slew rates of the first and second output signals.

4. The integrated circuit of claim 3, wherein the phase selection unit comprises a multiplexer including first, second, third and fourth multiplex input terminals, a first multiplex output terminal connected to the first capacitor unit, and a second multiplex output terminal connected to the second capacitor unit;

wherein in the second mode, the first signal is input to the first multiplex input terminal and output to the first multiplex output terminal, and the second signal is input to the second multiplex input terminal and output to the second multiplex output terminal; and
    wherein in the first mode, the second signal is input to the third multiplex input terminal and output to the first multiplex output terminal, and the first signal is input to the fourth multiplex input terminal and output to the second multiplex output terminal.

5. The integrated circuit of claim 1, wherein the first capacitor unit comprises a plurality of third capacitors connected in parallel between the phase selection unit and the first output terminal, and
    wherein the second capacitor unit comprises a plurality of fourth capacitors connected in parallel between the phase selection unit and the second output terminal.

6. The integrated circuit of claim 5, wherein the first capacitance is based on a number of capacitors connected between the phase selection unit and the first output terminal among the plurality of third capacitors, and
    the second capacitance is based on a number of capacitors connected between the phase selection unit and the second output terminal among the plurality of fourth capacitors.

7. The integrated circuit of claim 6, wherein, in the first mode, the slew rate of the first output signal decreases as the first capacitance is increased, and
    in a second mode, the slew rate of the first output signal increases as the first capacitance is increased.

8. The integrated circuit of claim 6, wherein the first capacitor unit connects all or some of the plurality of third capacitors between the phase selection unit and the first output terminal, and
    the second capacitor unit connects all or some of the plurality of fourth capacitors between the phase selection unit and the second output terminal.

9. An integrated circuit, comprising:
    a driver configured to receive a first signal having a first phase from an input terminal and to output a first output signal to an output node; and
    a slew rate control unit connected in parallel with the driver between the input terminal and the output node and configured to receive the first signal and to control a slew rate of the first output signal,
    wherein the slew rate control unit comprises:
    a phase selection unit configured, in a first mode, to receive the first signal and to output a second signal having a second phase opposite to that of the first phase, and configured, in a second mode, to receive the first signal and to output a third signal having the first phase; and
    a capacitor unit connected with the phase selection unit and configured, in the first mode, to pass the second signal through a capacitor disposed between the phase selection unit and the output node to output a fourth signal, and configured, in the second mode, to pass the third signal through the capacitor to output a fifth signal.

10. The integrated circuit of claim 9, wherein, in the first mode, a second output signal, which is obtained by adding the fourth signal to the first output signal at the output node, is output to an output terminal;
    wherein, in the second mode, a third output signal, which is obtained by adding the fifth signal to the first output signal at the output node, is output to the output terminal;

wherein the second output signal is obtained by decreasing the slew rate of the first output signal; and wherein the third output signal is obtained by increasing the slew rate of the first output signal.

11. The integrated circuit of claim 10, wherein the phase selection unit comprises a multiplexer configured to receive the first signal and a sixth signal having the second phase, to select one of the first and sixth signals in response to a slew rate control signal and to output the selected one of the first and sixth signals;

wherein the multiplexer is configured to output the sixth signal in response to the slew rate control signal in the first mode, and to output the first signal in response to the slew rate control signal in the second mode; and wherein the sixth signal is the same as the second signal, and the first signal is the same as the third signal.

12. The integrated circuit of claim 10, wherein the capacitor of the capacitor unit comprises first and second capacitors connected in parallel with each other, and wherein the capacitor unit selectively connects the first and second capacitors between an input terminal of the phase selection unit and the output terminal.

13. The integrated circuit of claim 12, wherein the slew rate of the second output signal when the first capacitor is connected is higher than the slew rate of the second output signal when both the first and second capacitors are connected, and wherein the slew rate of the third output signal when the first capacitor is connected is lower than the slew rate of the third output signal when both the first and second capacitors are connected.

14. The integrated circuit of claim 12, further comprising:
a first switch connected in series with the first capacitor; and
a second switch connected in series with the second capacitor.

15. The integrated circuit of claim 9, wherein the third signal is the same as the first signal.

16. An integrated circuit, comprising:
a differential signal driver configured to receive a first signal and a second signal, wherein the second signal is a differential signal of the first signal, and to output a first output signal corresponding to the first signal to a first output terminal and a second output signal corresponding to the second signal to a second output terminal;
a phase selection unit configured to receive the first signal and the second signal and to output a third signal and a fourth signal in response to a slew rate control signal;
a first capacitor unit connected to the phase selection unit and the first output terminal and configured to receive the third signal, to generate a fifth signal in response to the third signal, and to supply the fifth signal to the first output terminal, wherein the fifth signal alters a slew rate of the first output signal based on a first capacitance of the first capacitor unit; and
a second capacitor unit connected to the phase selection unit and the second output terminal and configured to receive the fourth signal, to generate a sixth signal in response to the fourth signal, and to supply the sixth signal to the second output terminal, wherein the sixth signal alters a slew rate of the second output signal based on a second capacitance of the second capacitor unit, wherein the phase selection unit comprises first and second multiplex output terminals;

wherein the phase selection unit is configured, in a first mode, to supply the first signal to the second multiplex output terminal as the fourth signal and to supply the second signal to the first multiplex output terminal as the third signal; and wherein the phase selection unit is configured, in a second mode, to supply the first signal to the first multiplex output terminal as the third signal and to supply the second signal to the second multiplex output terminal as the fourth signal.

17. The integrated circuit of claim 16, wherein, in the first mode, the fifth signal reduces the slew rate of the first output signal and the sixth signal reduces the slew rate of the second output signal, and in the second mode, the fifth signal increases the slew rate of the first output signal and the sixth signal increases the slew rate of the second output signal.

18. The integrated circuit of claim 16, wherein the first capacitor unit comprises a plurality of first capacitors connected in parallel and a plurality of first switches connected in series with respective ones of the first capacitors; and wherein the second capacitor unit comprises a plurality of second capacitors connected in parallel and a plurality of second switches connected in series with respective ones of the second capacitors.

19. The integrated circuit of claim 18, wherein the first capacitance of the first capacitor unit is controllable by the plurality of first switches and the second capacitance of the second capacitor unit is controllable by the plurality of second switches.

* * * * *